(12) United States Patent
Hayashi et al.

(10) Patent No.: US 9,488,332 B2
(45) Date of Patent: Nov. 8, 2016

(54) LIGHT EMITTING DEVICE AND METHOD OF MANUFACTURING LIGHT EMITTING DEVICE AND OPTICAL COMPONENT USED IN THE SAME

(71) Applicant: NICHIA CORPORATION, Anan-shi, Tokushima (JP)

(72) Inventors: Yukihiro Hayashi, Tokushima (JP); Naoto Morizumi, Tokushima (JP); Takeshi Okada, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 126 days.

(21) Appl. No.: 14/098,992

(22) Filed: Dec. 6, 2013

(65) Prior Publication Data

US 2014/0160759 A1  Jun. 12, 2014

(30) Foreign Application Priority Data

Dec. 11, 2012 (JP) .................................. 2012-269914
Jun. 12, 2013 (JP) .................................. 2013-123632
Nov. 27, 2013 (JP) .................................. 2013-244607

(51) Int. Cl.
*F21V 7/22* (2006.01)
*F21V 7/10* (2006.01)
(Continued)

(52) U.S. Cl.
CPC . *F21V 7/22* (2013.01); *F21V 7/10* (2013.01); *H01S 5/02212* (2013.01); *H01L 33/58* (2013.01); *Y10T 29/49002* (2015.01)

(58) Field of Classification Search
CPC .............................. F21V 13/04; G02B 6/0008
USPC ....................................................... 362/307
See application file for complete search history.

(56) References Cited

U.S. PATENT DOCUMENTS 4,641,027 A * 2/1987 Renner .................... G01L 3/12
                                                            250/231.14
4,761,054 A * 8/1988 Ishimori ................ A61B 18/20
                                                            385/100
(Continued)

FOREIGN PATENT DOCUMENTS

EP      1 926 154 A2     5/2008
JP      2005-283563      10/2005
(Continued)

OTHER PUBLICATIONS

Machine translation of WO2012165347A1.*
(Continued)

*Primary Examiner* — Anh Mai
*Assistant Examiner* — Zachary J Snyder
(74) *Attorney, Agent, or Firm* — Foley & Lardner LLP

(57) ABSTRACT

A light emitting device wherein discoloration of a reflective layer in an optical component can be prevented and a stable optical output power can be maintained, and a method of manufacturing an optical component used in the light emitting device. The optical component includes a supporting member defining a through-hole, a reflective layer formed on an inner wall defining the through-hole, a protective layer formed on the reflective layer, and a light transmissive member having a light incident surface, a light emitting surface, and an outer circumference side-surface, and disposed in the through hole. The light transmissive member is fixed in the through-hole with a joining portion where the outer circumference side-surface and the protective layer are joined, and an end portion at the light emitting side of the joining portion is covered with a second protective layer disposed continuously on the protective layer and the light transmissive member.

22 Claims, 3 Drawing Sheets

(51) Int. Cl.
  *H01S 5/022* (2006.01)
  *H01L 33/58* (2010.01)

(56) References Cited

U.S. PATENT DOCUMENTS

| | | | | |
|---|---|---|---|---|
| 7,878,696 B2* | 2/2011 | Hama | .................. | G02B 6/0003 362/555 |
| 2006/0279950 A1* | 12/2006 | Hama | .................. | A61B 1/0653 362/257 |
| 2008/0089089 A1* | 4/2008 | Hama | .................. | A61B 1/0653 362/574 |
| 2008/0262316 A1* | 10/2008 | Ajima | .................. | A61B 1/0669 600/178 |
| 2011/0141763 A1* | 6/2011 | Kamee | .................. | G02B 6/0008 362/583 |
| 2012/0049225 A1 | 3/2012 | Wakaki | | |
| 2012/0136211 A1* | 5/2012 | Komukai | ............. | A61B 1/0653 600/160 |
| 2012/0205693 A1 | 8/2012 | Ong et al. | | |

FOREIGN PATENT DOCUMENTS

| | | |
|---|---|---|
| JP | 2008-27941 A | 2/2008 |
| JP | 2009-260053 A | 11/2009 |
| JP | 2009-272576 A | 11/2009 |
| JP | 2012-69539 A | 4/2012 |
| WO | WO2012165347 A1 * | 12/2012 |

OTHER PUBLICATIONS

EP Search of Appln. No. 13196481.9 dated Apr. 10, 2014 in English.

\* cited by examiner

LIGHT EMITTING DEVICE AND METHOD OF MANUFACTURING LIGHT EMITTING DEVICE AND OPTICAL COMPONENT USED IN THE SAME

CROSS-REFERENCE TO RELATED APPLICATION

This application claims priority to Japanese Patent Application No. 2012-269914, filed on Dec. 11, 2012, No. 2013-123632, filed on Jun. 12, 2013, and Japanese Patent Application No. 2013-244607, filed on Nov. 27, 2013. The entire disclosure of Japanese Patent Application No. 2012-269914, No. 2013-123632 and No. 2013-244607 are hereby incorporated herein by reference.

BACKGROUND OF THE INVENTION

1. Technical Field

The present disclosure relates to a light emitting device and a method of manufacturing a light emitting device and optical device used in the same.

2. Background Art

In recent years, light emitting devices employing laser diodes or the like as a light source have been proposed (Patent Literature 1: JP2008-027941A, Patent Literature 2: JP2009-260053A, Patent Literature 3: JP 2009-272576A). Those light emitting devices each has an optical component which includes a supporting member defining a through-hole and a light-transmissive member disposed to close the through-hole. Light from the light source is emitted through the light-transmissive member. Also, a reflective layer is provided on the supporting member to improve the light extraction efficiency.

RELATED ART DOCUMENTS

Patent Literatures

Patent Literature 1: JP2008-027941A
Patent Literature 2: JP 2009-260053A
Patent Literature 3: JP 2009-272576A However, in the conventional light emitting devices, the reflective layer in an optical component may be discolored in the course of time, which may resulting in a decrease in optical output power. Accordingly an object of the present invention is to provide a light emitting device in which discoloration of a reflective layer in an optical component can be prevented and a stable optical output power can be maintained, and to provide a method of manufacturing an optical component used in the light emitting device.

An optical component according to embodiments of the present invention includes a supporting member defining a through-hole, a reflective layer formed on an inner wall defining the through-hole, a first protective layer formed on the reflective layer, and a light-transmissive member having a light incident surface, a light emitting surface, and an outer circumference side surface and disposed in the through hole.

SUMMARY OF THE INVENTION

The light-transmissive member is fixed in the through-hole by a joining portion where the outer circumference side surface and the first protective layer are joined. The end portion at the light emitting side of the joining portion is covered with a second protective layer formed continuously on the first protective layer and the light-transmissive member.

A method of manufacturing an optical component according to embodiments of the present invention includes preparing a supporting member defining a through-hole with an opening for incident light and an opening for emitting light, and forming a reflective layer on an inner wall defining the through-hole;

forming a reflective layer on an inner wall defining the through-hole;

forming a first protective layer on the reflective layer;

joining an outer circumference side surface of a light-transmissive member which includes a light incident surface, a light emitting surface, and an outer circumference side surface to the first protective layer, by using a treatment with heating; and forming a second protective layer covering an end portion of light emitting side of the joining portion of the outer circumference side surface and the first protective layer, continuously on the first protective layer and the light-transmissive member.

According to embodiments of the present invention, an optical component capable of maintaining a stable optical output power can be provided. According to a method of manufacturing an optical component of the present invention, a method of manufacturing an optical component capable of maintaining a stable optical output power can be provided.

DETAILED DESCRIPTION

The following description will describe a method of manufacturing an optical component 10 according the present embodiment and a light emitting device 100 which uses the same, with reference to the drawings. The embodiments shown below are intended as illustrative to give a concrete form to technical ideas of the present invention, and the scope of the invention is not limited to those described below.

Figure 1:
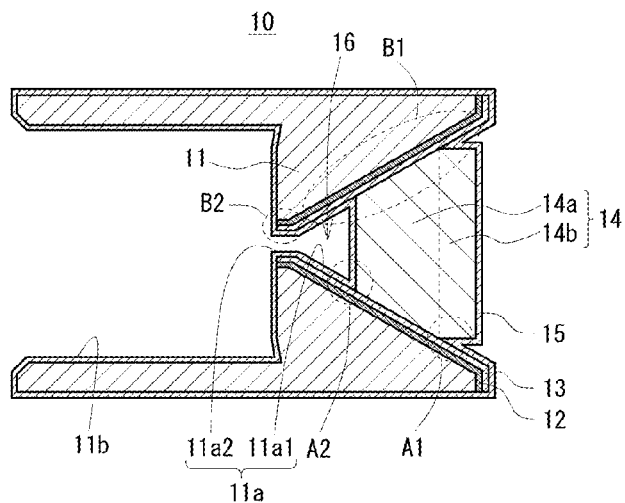
FIG. 1 is a cross-sectional view of an optical component according to an embodiment of the invention taken along line X-X of FIG. 2.
Figure 2:
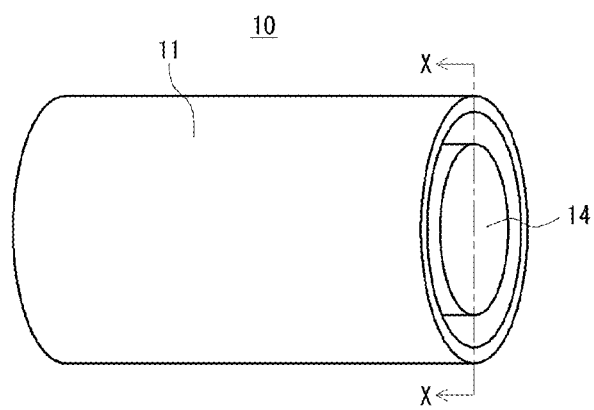
FIG. 2 is a perspective view of an optical component according to an embodiment.
Figure 3:
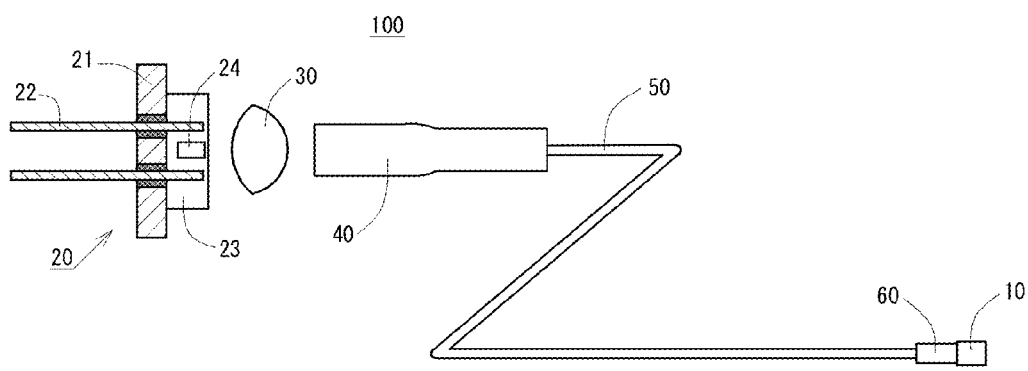
FIG. 3 is a block diagram showing an example of a light emitting device which employs the optical component shown in FIG. 1 and FIG. 2.
Figure 4:
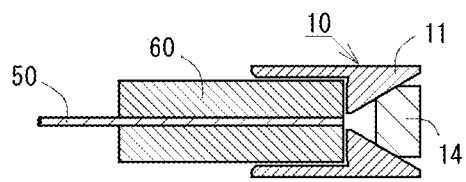
FIG. 4 is a cross-sectional view showing a tip portion of the light emitting device shown in FIG. 3.

FIG. 1 is a cross-sectional view of an optical component 10. FIG. 2 is a perspective view of the optical component 10 and a cross-sectional view taken along line X-X of FIG. 2 corresponds to FIG. 1. Further, FIG. 3 is a block diagram illustrating a structure of the light emitting device 100 which uses the optical component 10, and FIG. 4 is a cross-sectional view illustrating a structure of the tip portion (in the vicinity of optical component 10) of the light emitting device 100. In FIG. 2, FIG. 3 and FIG. 4, the figures are simplified and the reflective layer 12, the first protective layer 13, and the second protective layer 15 shown in FIG. 1 are omitted.

The optical member 10 includes a supporting member 11 defining a light source-side insertion hole 11b and a through-hole 11a, and a light-transmissive member 14 disposed to close the through-hole 11a. In the supporting member 11, the through-hole 11a is defined in an approximately conical shape with a widening opening portion 11a1 with a progressively increasing in inner diameter from the light incident side to the light emitting side and a connecting portion 11a2 with an uniform inner diameter which is located adjacent to the light incident side of the widening opening portion 11a1. The through-hole 11a is connected to the light source-side insertion hole 11b at an end of its connecting portion 11a2. In the present embodiment, the inner wall defining the widening opening portion 11a1 of the through-hole 11a is referred to as a "sloped portion B1" and the inner wall defining the connecting portion 11a2 is referred to as a "non-sloped portion B2" (see FIG. 1). The inner diameter of the light source-side insertion hole 11b is larger than the inner diameter of the connecting portion 11a2, and the light source-side insertion hole 11b and the through-hole 11a are coaxially defined in the supporting member 11. Also, a reflective layer 12 is formed on the inner wall defining the through-hole 11a, that is, on the sloped portion B1 and the non-sloped portion B2, and a first protective layer 13 is formed on the reflective layer 12. The reflective layer 12 may be, as shown in FIG. 1, extended on the light emitting side end-surface of the supporting member 11. In the case where the reflective layer 12 is extended on the light emitting side end surface of the supporting member 11, it is preferable that the first protective layer 13 is also extended on the reflective layer 12.

The light transmissive member 14 has a light incident surface and a light emitting surface which has a larger diameter than that of the light incident surface, and is constituted with a first light transmissive part 14a with a progressively increasing in outer diameter from the light incident surface toward the light emitting surface, and a second light transmissive part 14b with a cylindrical shape having a uniform external diameter. In the light transmissive member 14, the outer circumference side surface of the first light transmissive part 14a has an inclination in conformity with that of the sloped portion B1 of the widening opening portion 11a1. Thus, when the light transmissive member 14 is inserted in the widening opening portion 11a1 of the through-hole 14, the outer circumference side surface of the first light tranmsissive part 14a and the first protective layer 13 formed on the sloped portion B1 via the reflective layer 12 are in surface contact with each other.

The light incident surface of the light transmissive member 14 is designed larger than the inner diameter of the connecting portion 11a2 of the through-hole 11a, which allows for a light-guiding space 16 between the opening portion of the connecting portion 11a2 at a bottom surface defining the light source-side insertion hole 11b and the light incident surface of the light transmissive member 14, in an approximately pyramidal shape with progressively increasing inner diameter from the opening portion of the connecting portion 11a2 toward the light incident surface of the light transmissive member 14. With the light guiding space 16, an efficient incidence of light from the light source to the light transmissive member 14 can be obtained. That is, in the case where the light guiding space 16 is not provided, and the light incident surface of the light transmissive member 14 is located at an end portion or inside the connecting portion 11a2 or near the connecting portion 11a2, incident light is reflected at the light incident surface of the light transmissive member 14 and returning light toward the light source-side insertion hole 11b occurs. However, provision of the light guiding space 16 allows light from the light source to be reflected at the reflective layer 12 formed on the sloped portion B1 defining the light guiding space 16, and efficient incidence of the light in the light transmissive member 14 can be achieved.

The light emitting surface of the light transmissive member 14 is designed smaller than the opening diameter of the light emitting side of the widening opening portion 11a1 of the through-hole 11a, and a narrow gap is defined between the outer circumference side-surface of the second light transmissive part 14b of the light transmissive member 14 and the sloped portion B1 located at the light emitting side of the widening opening portion. With the provision of the second light transmissive part 14b at the light emitting side of the light transmissive member 14, and the gap between the outer circumference side-surface of the second light transmissive part 14b and the sloped portion B1, light passing inside the light transmissive member 14 can be reflected at the outer circumference side-surface, that is at the interface between the second light transmissive part 14b and the space in the gap, and further, light passed through the interface can be reflected at the reflective layer 12 formed on the sloped portion B1 and emitted in forward direction without re-entering the second light transmissive part 14b. With this arrangement, the directivity of light emitted from the light transmissive member 14 can be enhanced and good light distribution characteristics can be maintained.

Also, the entire outer surfaces of the optical component 10 including the side surfaces defining the light guiding space 16 and the surfaces defining the gap are covered with the second protective layer 15.

With the arrangement as described above, in addition to the reflective layer 12 being covered with the first protective layer 13, it is further covered with the second protective layer 15, thus, discoloration of the reflective layer 12 can be efficiently prevented.

In the optical component 10 according to the embodiment shown in FIG. 1, not only the surface of the first protective layer 13 but also the surface of the light transmissive member 14 and the entire surfaces of the supporting member 11 are covered with the second protective layer 15. The present invention is not limited thereto, and the second protective layer 15 is sufficient to be formed to cover the first protective layer 13 which is exposed after inserting and joining the light transmissive member 14 in the through-hole 11a.

A method of manufacturing the optical component 10 according to an embodiment of the present invention includes disposing a reflective layer 12 on a supporting member 11, disposing a first protective layer 13 on the reflective layer 12, joining the light transmissive member 14 with the first protective layer 13 by using a treatment with heat, and disposing a second protective layer 15 on a surface of the first protective layer 13 exposed after joining the light transmissive member 14 and on the surface of the light transmissive member 14.

Further, the second protective layer 15 is preferably formed to cover the entire surfaces of the first protective layer 13, but is sufficient to be disposed at least on the region A1 and the region A2 shown in FIG. 1. Hereinafter, more detail explanation will be provided.

Generally, if a reflective layer 12 and a light transmissive member 14 are directly joined by a treatment with heat, the reflective layer 12 likely discolored and darkened due to sulfuration etc. For this reason, in the present embodiment, the reflective layer 12 and the light transmissive member 14 are not directly joined, but instead a first protective layer 13 is disposed on the reflective member 12 and the first protective layer 13 and the light transmissive member 14 are joined. However, it was found that even the first protective layer 13 is disposed, due to the treatment with heat, generation of cracks tends to occur in the first protective layer 13 at an end portion of the joined portion of the first protective layer 13 and the light transmissive member 14. This is considered due to difference in the coefficient of thermal expansion between the first protective layer 13 and the light transmissive member 14. The generation of cracks in the first protective layer 13 may lead discoloration of the reflective layer, caused by sulfuration etc., which results in a decrease in the optical output power of the light emitting device to which it is incorporated. For this reason, in an embodiment of a method of manufacturing an optical component according to the present invention, after joining the light transmissive member 14 to the first protective layer 13, the second protective layer 15 is disposed continuously on the first protective layer 13 disposed on an end portion of the joining portion where cracks tend to occur in the first protective layer 13 and the light transmissive member 14. Thus, preventing the reflective layer 12 from discoloration caused by sulfuration or the like. In the present embodiment, the end portions of the joining portion are formed in a region (indicated as A2 in FIG. 1) in the vicinity of outer circumference end portion of the light incident surface of the light transmissive member 14 and in a region (indicated as A1 in FIG. 1) in the vicinity of outer circumference end portion of the interface of the first light emitting part 14a and the second light transmissive part 14b.

Also, in an embodiment of a method of manufacturing an optical component according to the present invention, after a treatment with heat, the second protective layer 15 is disposed by using an atomic layer deposition method (hereinafter may be referred to as "ALD"). The layer (second protective layer 15) formed by way of ALD has fewer pinholes compared to the layers made by way of sputtering etc and obtains higher quality. Accordingly, discoloration of the reflective layer 12 can be prevented efficiently. Further, in ALD, the reaction constituents (precursors) have low tendency to travel in a straight line, so that even in the case where cracks are generated in the first protective layer 13, the surfaces of the cracks can be coated reliably and efficiently. As a result, discoloration of the reflective layer 12 can be greatly suppressed, which can reduce the decrease in the optical output power in the final light emitting device where the optical component is used in combination with the light source. Also, in the optical component shown in FIG. 1, in the case where the second protective layer 15 is formed continuously on the first protective layer 13 formed on an end portion of the joining portion of the first protective layer 13 and the light transmissive member 14 and on the light transmissive member 14, the second protective layer 15 is further preferably formed by using an atomic layer deposition method. That is, the end portion of the joining portion of the first protective layer 13 and the light transmissive member 14 is as indicated with A2 in FIG. 1, located in the light guiding space 16 defined in an approximately conical shape, which is defined with a narrower opening. Also, the region of the end portion of the joining portion of the first protective layer 13 and the light transmissive member 14 indicated with A1 in FIG. 1 is located in a deep portion of a narrow gap defined between the outer circumference side-surface of the second light transmissive part of the light transmissive member 14 and the sloped portion B1. However, with the use of an atomic layer deposition method, even the end portion of the joining portion of the first protective layer 13 and the light transmissive member 14 is located in the light guiding space 16 or in a deep portion of the narrow gap, the second protective layer 15 can be formed reliably and efficiently on the end portion.

Next, each step of manufacturing the optical component 10 will be described.

Formation of Reflective layer

First, by way of sputtering or the like, the reflective layer 12 is formed on the inner wall defining the through-hole 11a of the supporting member 11. As described below, the reflective layer 12 is adapted to reflect the light incident in the through-hole 11a to the light emitting side to improve the light extraction efficiency, when the optical component 10 is incorporated in the light emitting device 100.

In this embodiment, the supporting member 11 defines a through-hole 11a, which, as described above, will be closed by a light transmissive member 14 while joining the light transmissive member 14 later in the method. When the optical component 10 is incorporated in the light emitting device 100 for completion, the light from the light source 20 is extracted to outside of the device through the through-hole 11a of the supporting member and through the light transmissive member 14.

Examples of the material of the supporting member 11 include iron and iron alloys. Among those, in the case where borosilicate glass is used for the light transmissive member, kovar (iron-cobalt alloy) is preferably used for the material of the supporting member 11 in consideration of matching the thermal expansion coefficient.

As shown in FIG. 1, the supporting member 11 may include a sloped portion B1 on the inner wall defining the through hole 11a, where the opening of the through-hole 11a increases from the light incident side (left side in FIG. 1) toward the light emitting side (right side in FIG. 1). In this case, the first protective layer 13 and the light transmissive member 14 are joined at the sloped portion B1. With such a construction, in completion of the light emitting device, light incident in the through-hole 11a can be reflected at the reflective layer 12, and the light output power can be improved. Also, the supporting member 11 is provided with the sloped portion B1 having an inclination corresponding to the outer circumference side-surface of the first light transmissive part 14a of the light transmissive member 14, which facilitates pressure bonding of the light transmissive member 14 to the supporting member 11, thus, joining of the both by way of fusion bonding can also be facilitated.

As shown in FIG. 1, in the case where the light transmissive layer 14 is joined to the inner wall defining the through-hole 11a, the reflective layer 12 can be formed at least on the inner wall defining the through-hole 11a.

Examples of the material of the reflective layer 12 include various materials containing silver or aluminum, and among those, a material containing silver is particularly preferable. Silver is susceptible to discoloration due to sulfurization etc., but has excellent reflectance, so that light passing through the light-transmissive member 14 can be reflected efficiently. According to the embodiments of the present invention, even in the case where the reflective layer 12 is made of silver which is susceptible to discoloration, the discoloration can be prevented by the second protective layer 15. Thus, high reflectance of silver can be maintained for a long period of time, so that deterioration of the light output power can be significantly suppressed.

The reflective layer 12 may have a thickness of, preferably 0.1 to 10 μm, further preferably 0.3 to 5 μm, more preferably 0.7 to 3 μm. This is because with an insufficient thickness, the reflective layer will be susceptible to deterioration due to heat, and with an excessive thickness, working efficiency will decrease.

Formation of First Protective Layer

Next, by way of sputtering or the like, a first protective layer 13 is formed on the reflective layer 12. The first protective layer 13 is to prevent discoloration of the reflective layer 12 due to sulfuration etc, during a treatment with heat.

Examples of the materials of the first protective layer 13 include silicon oxide, aluminum oxide, silicon nitride, aluminum nitride, titanium oxide, and tantalum oxide. Among those, silicon oxide or aluminum oxide is preferable, and silicon oxide is more preferable. This is because with the use of those materials, the high reflectance obtained by the reflective layer 12 can be maintained and the high level of stable output characteristics can be achieved.

In FIG. 1, the first protective layer 13 is formed only on the surface of the reflective layer 12, but not only on the reflective layer 12, but together with the surface of the supporting member 11 which is not provide with the reflective layer 12 can be coated with the first protective layer 13. With this arrangement, at the time of applying the treatment with heat, a layer of oxide due to oxidation of the supporting member 11 etc., can be prevented from attaching to the supporting member 11. If an adhered material is attached on the supporting member 11 and a light emitting device is completed with the supporting member 11, light from the light source may be blocked by the adhered material which may result in a decrease of the optical output power of the light emitting device.

The first protective layer may have a thickness of preferably 0.01 to 5 μm, more preferably 0.05 to 3 μm, and further preferably 0.1 to 2 μm. This is because with an insufficient thickness, the functions of the protective layer may be insufficient, and with an excessive thickness, the protective layer may absorb light which leads a decrease in the output power or may become prone to cracks.

Joining of Light Transmissive Member

Next, the light transmissive member 14 is inserted in the through-hole 11a of the supporting member 11, and by using a treatment with heat, a region of the first protective layer 13 and the outer circumference side-surface of the first light transmissive part 14a of the light transmissive portion 14 are joined. The light transmissive member 14 is to allow the light from the light source 20 to transmit therethrough and finally to outside.

For the treatment with heat, joining with the use of a thermosetting resin (hereinafter, simply referred to as "resin joining"), joining with the use of a brazing material (hereinafter, simply referred to as "brazing joining"), joining by fusion (hereinafter, simply referred to as "fusion joining"), etc., may be employed. Among those, in order to secure good joining without decreasing the reflectance of the reflective layer 12, brazing joining or fusion joining is preferably employed, and fusion joining is more preferably employed.

Generally, higher treatment temperature is used in the order of resin joining, brazing joining, and fusion joining, but higher the treatment temperature the more susceptible to cracks in the first protective layer 13. However, according to the embodiments of the present invention, a great effect against the discoloration of the reflective layer 12 can be achieved by the second protective layer 15, which allows application of fusion joining which requires a high treatment temperature.

In the case where a mixture of borosilicate glass and a fluorescent material is used for the light transmissive member 14, a method such as a sintering method in which particles of a row material are heated and molded can be employed. With the fluorescent material contained in the light transmissive member 14, light from the light source 20 can be converted into light of different wavelength, so that in the case where the optical component 10 is incorporated in a light emitting device, for example, mixed light (white light) of light from the light source 20 (blue light) and light from the fluorescent material (yellow) can be extracted. Of course, the fluorescent material is not necessarily contained in the light transmissive member, or particles of silicon oxide or titanium oxide may be contained as a light scattering material.

Formation of Second Protective Layer

Next, for example, with the use of ALD, the second protective layer 15 is disposed (see FIG. 1). In the optical component 10 shown in FIG. 1, the second protective layer 15 is formed on the entire outer surfaces of the optical component 10 including the side surface defining the light guide space 16 and the surfaces defining the gap created between the outer circumference side-surface of the second light transmissive part 14b and the sloped surface B1. However, according to the embodiments of the present invention, sufficient effect can be achieved by forming the second protective layer 15 at least on the region A1 in the gap as described above. Further, the second protective layer 15 is preferably formed on the region A1 in the gap described above and the region A2 defining the light guide space 16 described above. Also, in the embodiments of the present invention, the method of forming the second protective layer 15 is not limited to ALD, but ALD in which a desired layer is formed on the molecular level at each time, has advantages as described below which are different from the conventional methods such as sputtering. The following describes a case where a protective layer of aluminum oxide ($Al_2O_3$) is deposited and formed using TMA (trimethyl aluminum) and water ($H_2O$).

First, TMA gas is introduced to react with the hydroxyl group on the surface of the reflective layer which is the object (first reaction). Next, the excess gas is purged. Thereafter, $H_2O$ gas is introduced to react with the TMA which is bonded to the hydroxyl group in the first reaction (second reaction). Next, the excess gas is purged. Then, setting the first reaction, purging, the second reaction, and purging as one cycle, the cycle is repeated to obtain $Al_2O_3$ with a predetermined thickness.

With ALD, the protective layer is formed with a single molecular layer at each cycle, so that the layer has fewer pinholes compared to the protective layers made by way of conventional method, and obtains higher quality. Further, in ALD, the reaction constituents have low tendency to travel in a straight line, so that the precursors can be supplied even in the cracks, which allows formation of the layer with excellent protective properties. Further, for the reasons as described above, even with a small thickness, the protective layer obtained by using ALD method is capable of sufficiently protecting the reflective layer 12. Thus, the protective layer can be formed with a smaller thickness than that of the protective layers obtained by using a conventional method. With this arrangement, absorption of light at the second protective layer 15 can be prevented, so that when the optical component 10 is combined with a light source 20, a light emitting device of high optical output can be obtained.

Further, with the use of ALD, as shown in FIG. 1, the second protective layer 15 can be formed continuously on the first protective layer 13 and the light transmissive member 14 on the region A1 in the narrow gap and the region A2 defining the light guide space 16 respectively. This is because, as described above, in ALD, the reaction constituents (precursors) have low tendency to travel in a straight line, so that unless providing a mask so as not to form the layer to an intended portions, the second protective layer 15 can be formed on entire regions. As described above, with the use of ALD, the second protective layer 15 can be formed on places as long as they are spatially continuous, so that not only in the optical component shown in FIG. 1, but also in the optical components with various structures in which the second protective layer 15 is needed to be formed continuously on the first protective layer 13 and the light transmissive member 14, either in a narrow space or in a space widening from its opening, discoloration of the reflective layer 12 caused by cracks generated in the first protective layer 13 can be prevented.

For the material of the second protective layer 15, for example, aluminum oxide, silicon oxide, aluminum nitride, titanium oxide, or silicon nitride can be used, and among those, aluminum oxide or silicon dioxide is preferably, aluminum oxide is more preferably used. With the use of those materials and by way of ALD, a layer having higher optical transparency can be formed, so that absorption of light from the light emitting element can be prevented and also, a layer of good quality with excellent protective properties can be obtained.

The second protective layer may have a thickness of preferably 0.001 to 0.2 μm, further preferably 0.005 to 0.2 μm, and more preferably 0.015 to 0.1 μm. This is because with an insufficient thickness, the functions of the protective layer may be insufficient, and with an excessive thickness, the protective layer may absorb light which leads a decrease in the light output power or may become prone to cracks.

Formation of the second protective layer 15 by way of ALD is described above, but for the method of forming the second protective layer 15, for example, in the case where an optical component has a structure in which end portions of the joining portion are not located in narrow gaps or in a light guiding space 16 with a narrow opening, which allows reaction constituent travels in a relatively straight line to form the second protective layer 15 in the vicinity of end portions of the joining portion, other than ALD, but a known technology such as sputtering can also be used. In this regard, with the use of ALD, a layer can be formed in a wide area with good quality, so that where possible, it is preferable to form the second protective layer by using ALD.

The optical component according to the embodiments of the present invention can be manufactured with the operations as described above.

The optical component 10 fabricated as described above can be combined with a light source 20 or the like to obtain a light emitting device 100, for example. FIG. 3 is a conceptual diagram for illustrating a general structure of the light emitting device 100, and FIG. 4 is a cross-sectional view for illustrating a structure in the vicinity of the optical component of the light emitting device 100. As shown in FIG. 3 and FIG. 4, the light emitting device 100 includes a light source 20, a lens for collecting light from the light source 20, a connector 40 for introducing the light from the light source 20 to an optical fiber 50, an optical fiber 50, a tip member 60 for holding the tip portion of the optical fiber 50, and an optical member 10 connected to the tip member 60. A part of light from the light source 20 is introduced in the optical component 10 through the optical fiber 50, and light of a mixed color of the light from the light source 20 and the light from the fluorescent material is finally extracted.

Also, the light source 20 includes a plate-like stem 21, leads 22 which are insulated from the stem 21 and fixed by penetrating the stem 21, a heat sink 23 disposed on the stem 21, and a laser diode 24 mounted on the heat sink 23.

The optical fiber 50 is not necessarily needed, and for example, a structure in which light from the lens 30 is irradiated directly to the light transmissive member 14 can be employed. Also, alternatively to the tip member 60, a light source 20 equipped with a semiconductor laser element can be inserted in the light source-side insertion hole 11b.

In the optical component 10 described above, the through-hole 11a of the supporting member 11 is defined in a circular cone shape and the light transmissive member 14 is formed with a shape which includes the first light transmissive part 14a having a circular truncated cone shape and the second light transmissive part 14b having a circular cylindrical shape. But, the through-hole 11a of the supporting member 11 may be defined in a polygonal pyramidal shape, the first light transmissive part 14a may be formed with a polygonal truncated pyramidal shape, and the second light transmissive part 14b may be formed with a polygonal pillar shape. In the present specification, the term a "truncated pyramidal shape" includes a circular truncated cone shape and a polygonal pyramidal shape, and the term a "pillar shape" includes a circular cylindrical shape and a polygonal pillar shape. Therefore, It is necessary that the bottom surface of the first light transmissive part 14a having a truncated pyramidal shape and the end surface of a pillar shape has the same cross-sectional shape. In the specification, the term a "bottom surface of the first light transmissive part 14a having a truncated pyramidal shape" indicates a surface of either the upper surface or lower surface of the first light transmissive part 14a having a truncated pyramidal shape, which has a larger surface area.

Figure 7:
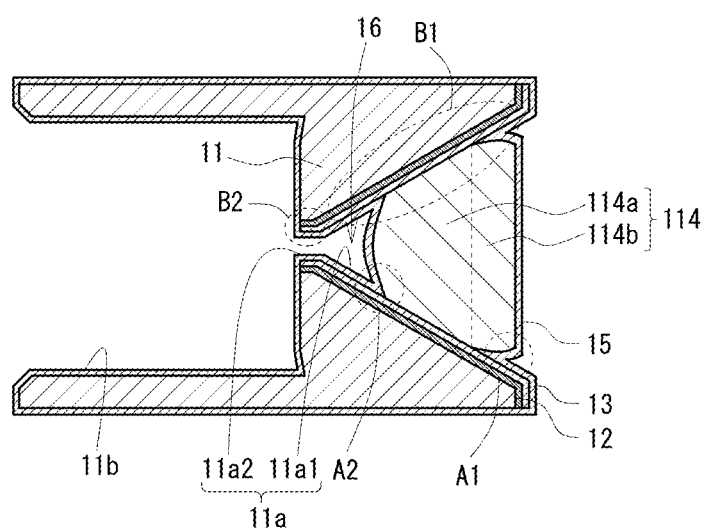
FIG. 7 is a cross-sectional view of an optical component according to a variant example of the present invention.

Also, in the optical component 10 of an embodiment, the light transmissive member 14 has a shape which includes a first light transmissive part 14a in a truncated cone shape and a second light transmissive part 14b in a circular cylindrical shape. But the present invention is not limited to this. For example, as shown in FIG. 7, with the use of the light transimissive member 114 which includes a first light transmissive part 114a having a light incident surface with a convex shape with respect to the first light-transmissive part 14a and a second light transmissive part 114b having its outer circumference side-surface bulging outward with respect to the second light transmissive part 14b, an optical component capable of exhibiting a same level of effects can be fabricated. In either the case where the second light transmissive part 14b or the second light transmissive part 114b is employed, a distance between the outer circumference side-surface of the second light transmissive part 14b and the inner wall defining the through-hole increases toward the light emitting surface.

EXAMPLE

A light emitting device 100 according to an Example will be described below with reference to FIGS. 1, 2, and 3.

First, the supporting member 11 mainly made of kovar was prepared. The supporting member 11 defines a through-hole 11a and a light source-side insertion hole 11b. The supporting member 11 has a length of 1.5 mm, and an outer diameter of ϕ0.88 mm, and a through-hole 11a with a diameter of 0.2 mm at light incident side and a diameter of 0.76 mm at light emitting side is defined at a center portion along the length direction of the supporting member 11. The through-hole 11a is defined with the sloped portion B1 and the non-sloped portion B2.

Next, the reflective layer 12 made of silver was formed with a thickness of 0.7 to 1.8 μm (the thickness is decreased from the light emitting side toward the light incident side), by sputtering from the light emitting side of the supporting member 11. As shown in FIG. 1, the reflective layer 12 is mainly formed on the upper surface (around the through-hole 11a at light emitting side) of the supporting member 11, the sloped portion B1, and the non-sloped portion B2.

Next, the first protective layer 13 made of silicon oxide was formed with a thickness of 0.6 to 1.5 μm (the thickness is decreased from the light emitting side toward the light incident side), by sputtering from the light emitting side of the supporting member 11. As shown in FIG. 1, the first protective layer 13 is mainly formed on the surfaces of the reflective layer 12.

Next, the light transmissive member 14 made from a mixture of silicon oxide and a fluorescent material by using sintering technology is prepared and the light transmissive member 14 is joined to the first protective layer 13. In the present example, a YAG-based fluorescent material was used as the fluorescent material. The fusion bonding was performed at about 850° C.

Next, by using ALD, the second protective layer 15 made of aluminum oxide was formed with a thickness of 20 nm. With the use of ALD technology, a layer is formed on the entire regions. Thus, as shown in FIG. 1, the second protective layer 15 is formed on approximately the entire surface (including the region A1 and the region A2) of the supporting member 11, the first protective layer 13 and the light transmissive member 14, except for the joining surface of the first protective layer 13 and the light transmissive member 14.

The optical component 10 obtained as described above was used to fabricate the light emitting device 100 shown in FIG. 3. The light emitting device 100 includes the light source 20, the lens 30 for collecting light from the light source 20, the optical fiber 50 for guiding the light from the lens 30, the tip member 60 provided at the tip end of the optical fiber 50, and the optical component 10. In the example, a side of the optical fiber 50 which is closer to the light source 20 is held by the connector 40. The optical fiber 50 is optically connected with the member containing the lens 30 by the connector 40.

The light source 20 includes a laser diode 21 made of a nitride semiconductor to emit blue light (peak wavelength of 450 nm). The light emitting device 100 is configured to emit white light by mixing the colors of blue light from the light source 20 and yellow light from the fluorescent material included in the light transmissive member 14. For the optical fiber 50, a SI-type optical fiber made of quartz (core diameter: 114 μm; clad diameter: 125 μm) was used. The tip member 60 is mainly made of a stainless-steel and has a circular cylindrical shape with a length (a lateral distance in FIG. 4) of 5.5 mm, and an external diameter of 0.65 mm. Further, a hole to hold the optical fiber 50 is provided at the center portion of the tip member 60.

Comparative Example

An optical component was fabricated with a similar structure as in Example except that the second protective layer 15 was not formed. Further, a light emitting device similar to that of Example was fabricated with the optical component.

Evaluation

Figure 5:
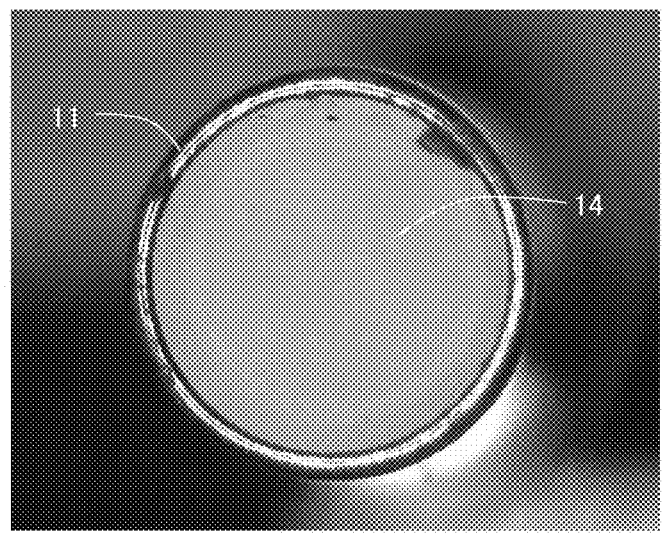
FIG. 5 is a photograph of an optical component according to an example, taken after a life-time test.
Figure 6:
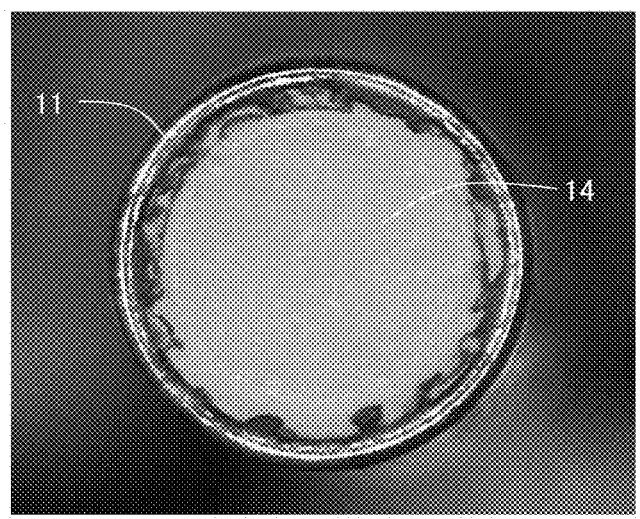
FIG. 6 is a photograph of an optical component according to a comparative example, taken after a life-time test.

FIG. 5 is a photograph of an optical component according to an example taken after a life-time test, which was performed on the light emitting device 100 of Example under predetermined conditions (atmosphere: air; output power of light source: 1 W; operation time: 500 hours). FIG. 6 is a photograph of an optical component according to a comparative example taken after a life-time test, which was performed on the light emitting device of Comparative Example, under equivalent conditions as in the above. Each picture was taken from the light emitting side of the optical component 10. Here, in FIG. 5 and FIG. 6, the light transmissive member 14 appears to be disposed on the entire surface of the through-hole 11a of the supporting member 11, but it only appears so, as the light transmissive member 14 is reflected on the reflective layer 12. That is, as shown in FIG. 1, at the light emitting side, the light transmissive member 14 is joined to the sloped portion B1 at a location somewhat away from the light emitting side plane of the supporting member 11 (that is, at a region spaced away from the light emitting side of the sloped portion B1), but the side surface of the light transmissive member 14 (surfaces extending in the lateral direction in FIG. 1) is reflected on the reflective layer 12 at the sloped portion B1, which makes an impression that the light transmissive member 14 is joined at the top end of the sloped portion B1 (the right end of the sloped portion B1 in FIG. 1).

As will be evident from a comparison of the pictures shown in FIG. 5 and FIG. 6, discoloration is observed in many locations in region A1 in Comparative Example (FIG. 6), whereas almost no discoloration is observed in the region A1 in Example (FIG. 5). Also, compared to the initial optical output power, after the life-time test, the light emitting device of Comparative Example exhibited a 11% decrease in the optical output power, whereas the light emitting device of Example exhibited a mere 3.5% decrease even after the life-time test. This is attributed that in the reflective layer of Comparative Example, discoloration occurred at a number of locations, whereas in the reflective layer of Example, discoloration occurs at only few locations.

As described above, it should be obvious that various other embodiments are possible without departing the spirit and scope of the present invention. Accordingly, the scope and spirit of the present invention should be limited only by the following claims.

What is claimed is:

1. An optical component comprising:
   a supporting member having an inner wall defining a through-hole;
   a reflective layer formed on the inner wall defining the through-hole;
   a first protective layer formed on the reflective layer;
   a light transmissive member having a light incident surface, a light emitting surface, and an outer circumference side-surface, and disposed in the through-hole, wherein at least a portion of the outer circumference side-surface of the light transmissive member is in direct contact with the first protective layer; and a second protective layer that covers at least (i) an interface at which said at least a portion of the outer circumference side-surface of the light transmissive member is in direct contact with the first protective layer, on a light emitting surface side of the light transmissive member, and (ii) an interface at which said at least a portion of the outer circumference side-surface of the light transmissive member is in direct contact with the first protective layer, on a light incident surface side of the light transmissive member.

2. The optical component according to claim 1, wherein a width of an opening of the through-hole increases from a light incident side toward a light emitting side.

3. The optical component according to claim 2, wherein the portion of the outer circumference side-surface of the light transmissive member that is in direct contact with the first protective layer has a truncated pyramidal shape.

4. The optical component according to claim 1, wherein the light transmissive member comprises:
  a first light transmissive part that is located at a light incident side and includes a light incident surface and the portion of the outer circumference side-surface that is in direct contact with the first protective layer, and
  a second light transmissive part that is located at a light emitting side of the first light transmissive part and includes a light emitting surface and a portion of the outer circumference side-surface that is separated from the first protective layer,
wherein a distance between the outer circumference side-surface of the second light transmissive portion and the inner wall defining the through-hole increases toward the light emitting surface.

5. The optical component according to claim 4,
wherein an end portion of the light emitting side of the portion of the outer circumference side-surface that is in direct contact with the first protective layer is arranged in a vicinity of a border between the first light transmissive part and the second light transmissive part, and
wherein the second protective layer is formed continuously on the first protective layer and on the portion of the outer circumference side-surface of the second light transmissive part that is separated from the first protective layer.

6. The optical component according to claim 1, wherein the reflective layer contains silver.

7. The optical component according to claim 1, wherein the first protective layer is made of silicon oxide.

8. The optical component according to claim 1, wherein the second protective layer is made of aluminum oxide.

9. The optical component according to claim 1, wherein the second protective layer has a thickness of 0.001 μm to 0.2 μm.

10. A light emitting device comprising an optical component according to claim 1 and a semiconductor laser element.

11. An optical component comprising:
  a supporting member having an inner wall defining a through-hole;
  a reflective layer formed on the inner wall defining the through-hole;
  a first protective layer formed on the reflective layer;
  a light transmissive member having a light incident surface, a light emitting surface, and an outer circumference side-surface, and disposed in the through-hole, wherein at least a portion of the outer circumference side-surface of the light transmissive member is in direct contact with the first protective layer; and
  a second protective layer that covers at least an interface at which said at least a portion of the outer circumference side-surface of the light transmissive member is in direct contact with the first protective layer, on a light emitting surface side of the light transmissive member,
wherein the light transmissive member comprises:
  a first light transmissive part that is located at a light incident side and includes a light incident surface and the portion of the outer circumference side-surface that is in direct contact with the first protective layer, and
  a second light transmissive part that is located at a light emitting side of the first light transmissive part and includes a light emitting surface and a portion of the outer circumference side-surface that is separated from the first protective layer,
wherein a distance between the outer circumference side-surface of the second light transmissive portion and the inner wall defining the through-hole increases toward the light emitting surface,
wherein an end portion of the light emitting side of the portion of the outer circumference side-surface that is in direct contact with the first protective layer is arranged in a vicinity of a border between the first light transmissive part and the second light transmissive part, and
wherein the second protective layer is formed continuously on the first protective layer and on the portion of the outer circumference side-surface of the second light transmissive part that is separated from the first protective layer.

12. The optical component according to claim 11, wherein the reflective layer contains silver.

13. The optical component according to claim 11, wherein the first protective layer is made of silicon oxide.

14. The optical component according to claim 11, wherein the second protective layer is made of aluminum oxide.

15. The optical component according to claim 11, wherein the second protective layer has a thickness of 0.001 μm to 0.2 μm.

16. A light emitting device comprising an optical component according to claim 11 and a semiconductor laser element.

17. An optical component comprising:
  a supporting member having an inner wall defining a through-hole;
  a reflective layer formed on the inner wall defining the through-hole;
  a first protective layer formed on the reflective layer;
  a light transmissive member having a light incident surface, a light emitting surface, and an outer circumference side-surface, and disposed in the through-hole, wherein at least a portion of the outer circumference side-surface of the light transmissive member is in direct contact with the first protective layer; and
  a second protective layer that covers at least an interface at which said at least a portion of the outer circumference side-surface of the light transmissive member is in direct contact with the first protective layer, on a light incident surface side of the light transmissive member, wherein the light transmissive member comprises:
- a first light transmissive part that is located at a light incident side and includes a light incident surface and the portion of the outer circumference side-surface that is in direct contact with the first protective layer, and
- a second light transmissive part that is located at a light emitting side of the first light transmissive part and includes a light emitting surface and a portion of the outer circumference side-surface that is separated from the first protective layer, wherein a distance between the outer circumference side-surface of the second light transmissive portion and the inner wall defining the through-hole increases toward the light emitting surface, wherein an end portion of the light emitting side of the portion of the outer circumference side-surface that is in direct contact with the first protective layer is arranged in a vicinity of a border between the first light transmissive part and the second light transmissive part, and wherein the second protective layer is formed continuously on the first protective layer and on the portion of the outer circumference side-surface of the second light transmissive part.

18. The optical component according to claim 17, wherein the reflective layer contains silver.

19. The optical component according to claim 17, wherein the first protective layer is made of silicon oxide.

20. The optical component according to claim 17, wherein the second protective layer is made of aluminum oxide.

21. The optical component according to claim 17, wherein the second protective layer has a thickness of 0.001 μm to 0.2 μm.

22. A light emitting device comprising an optical component according to claim 17 and a semiconductor laser element.

* * * * *